United States Patent
Li

(10) Patent No.: US 7,149,094 B2
(45) Date of Patent: Dec. 12, 2006

(54) MOUNTING ASSEMBLY

(75) Inventor: Chao-Kang Li, Taipei Hsien (TW)

(73) Assignee: Aopen, Inc., Taipei Hsien (TW)

( * ) Notice: Subject to any disclaimer, the term of this patent is extended or adjusted under 35 U.S.C. 154(b) by 266 days.

(21) Appl. No.: 10/792,106

(22) Filed: Mar. 3, 2004

(65) Prior Publication Data

US 2004/0174684 A1 Sep. 9, 2004

(30) Foreign Application Priority Data

Mar. 4, 2003 (TW) ................. 92203243 U
Jun. 27, 2003 (TW) ................. 92211737 U

(51) Int. Cl.
*H05K 7/14* (2006.01)
*H05K 7/18* (2006.01)

(52) U.S. Cl. ................. 361/801; 361/802; 361/756; 439/377

(58) Field of Classification Search ............. 361/801, 361/802, 756, 727, 741, 686; 439/377
See application file for complete search history.

(56) References Cited

U.S. PATENT DOCUMENTS

| 4,478,331 | A | * | 10/1984 | Ruin ........................... 206/707 |
| 5,383,793 | A | * | 1/1995 | Hsu et al. .................... 439/327 |
| 5,457,608 | A | * | 10/1995 | Scholder et al. ............ 361/752 |
| 5,754,406 | A | * | 5/1998 | Hardt et al. ................ 361/756 |
| 5,996,962 | A | * | 12/1999 | Chang et al. ............... 248/694 |
| 6,021,049 | A | * | 2/2000 | Thompson et al. ......... 361/759 |
| 6,752,276 | B1 | * | 6/2004 | Rumney .................. 211/41.17 |
| 6,885,565 | B1 | * | 4/2005 | Shi ............................ 361/801 |

* cited by examiner

*Primary Examiner*—Elvin Enad
*Assistant Examiner*—Hung S. Bui
(74) *Attorney, Agent, or Firm*—Thomas, Kayden, Horstemeyer & Risley

(57) ABSTRACT

A mounting assembly for a main board in a housing of an electronic device. The main board has an edge contacting the mounting assembly. The mounting assembly comprises a base and a clip. The base is disposed on the housing. The clip is disposed in the base slidably in a first direction and a second opposite direction. When moving in the first direction, the clip fixes the main board, and in the second direction, releases the main board. An acute angle is formed between the first and second directions and the edge.

16 Claims, 13 Drawing Sheets

MOUNTING ASSEMBLY

BACKGROUND OF THE INVENTION

1. Field of the Invention

The present invention relates in general to a mounting assembly and in particular to a mounting assembly for a main board in a housing.

2. Description of the Related Art

In conventional mounting of a main board to a housing, screws and tools are required, as shown in FIG. 5.

The main board 100 has several through holes 101 in required positions. Spacers 201 support the main board 100 such that a space is formed between the main board 100 and the housing 200. When connecting the main board 100 to the housing 200, the top of the spacer 201 supports the main board 100 and the bottom of the spacer 201 engages to the housing 200, and screws 103 pass through the holes 101 to secure the main board 100 to the spacer 201.

According to the method mentioned above, a tool such as a screwdriver is required to attach the main board 100 to or separate it from the spacer 201. Each corner of the main board 100 must be fastened, in this manner, such that the installation is complicated and time consuming. Furthermore, the engagement is compromised by screws 103 or spacers 201 dislodging.

Moreover, many holes 101 must be formed on the main board 100. Installed devices such as CPU, fan or slots must accommodate these holes 101. The position and quantity of the installed devices are limited by the holes, affecting assembly.

As well, each screw must be removed when detaching the main board, further affecting convenience.

SUMMARY OF THE INVENTION

Therefore, an object of the present invention is to provide a mounting assembly that solves the above mentioned problems.

The mounting assembly for a main board in a housing comprises a base and a clip. The base has a first engaging portion. The clip is disposed in the base slidably in a first direction and a second opposite direction. When moved in the first direction, the clip secures the main board, and when moved in the second direction, the clip releases the main board. The clip comprises a second engaging portion and an actuating portion. The second engaging portion engages the first engaging portion to limit the clip to only the first direction. The actuating portion releases the first and second engaging portions when force is applied on the actuating portion, enabling the clip to be moved in either direction.

A locating member is provided on the base to precisely locate the clip on the base.

The locating member comprises two tracks.

The first engaging portion comprises at least one rack with a series of teeth, with teeth of adjacent racks staggered and not overlapping.

The number of racks in the first engaging portion, and the number of teeth therein can be increased or decreased as needed.

The clip comprises a holding portion including a recess, to fix the main board a predetermined distance from the housing.

The second engaging portion comprises a plurality of hooks, and a plurality of teeth.

The first and second engaging portions function in opposite directions.

The actuating portion releases the first and second engaging portions by raising the second engaging portion, enabling the clip to be moved in either direction.

The present invention also provides another mounting assembly. The mounting assembly secures a main board in a housing of an electronic device, and the main board has a edge contacting the mounting assembly. The mounting assembly comprises a base and a clip. The base is disposed on the housing of the electronic device. The clip is disposed in the base slidably in a first direction and a second direction opposite thereto. When moved in the first direction, the clip secures the main board, and when moved in the second direction, the clip releases the main board. An acute angle is formed between the first and second directions and the edge.

The clip has a body and an actuating portion, the body slidably moving in the base and the actuating portion pivoting with the body.

The body of the clip comprises two flanges extending from both sides thereof, the clip sliding in the base via the two flanges.

The base comprises a first engaging portion, and the clip comprises a second engaging portion connected to the actuating portion. The first engaging portion engages the second engaging portion to limit the clip to only the first direction. The actuating portion releases the first and second engaging portions, enabling the clip to be moved in either direction.

The first engaging portion comprises at least one rack with a series of teeth, with teeth of two adjacent racks staggered and not overlapping.

The second engaging portion comprises a hook.

The body comprises a hole, and the actuating comprises a tab engaging the hole to prevent the first and second engaging portions from separating.

The base comprises an obstacle to prevent the clip separating from the base.

The obstacle comprises a wedge-shaped block.

The base also comprises a locating member to precisely locate the clip thereon.

The locating member comprises two tracks.

The clip comprises a first supporting portion abutting the main board.

The clip further comprises a second supporting portion fixing the main board.

The first supporting portion comprises a ramp facing the locating member and contacting the edge of the main board when the clip fixes the main board.

The first supporting portion comprises a plurality of ribs facing the locating member, each comprising a surface arranged on the ramp.

The base comprises a stem to separate the base from the housing of the electronic device.

The base is rectangular and comprises a first engaging portion disposed thereon.

The base further comprises two locating members disposed on both sides of the base, the first engaging portion disposed between the locating members.

The base further comprises a stem disposed at one end of the base to separate the base from the housing of the electronic device.

With the present invention, the main board connects to the housing by a mounting assembly out requiring tools or screws, applicable with any size of main board, enhancing efficiency of assembly and removal.

DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

Figure 1:
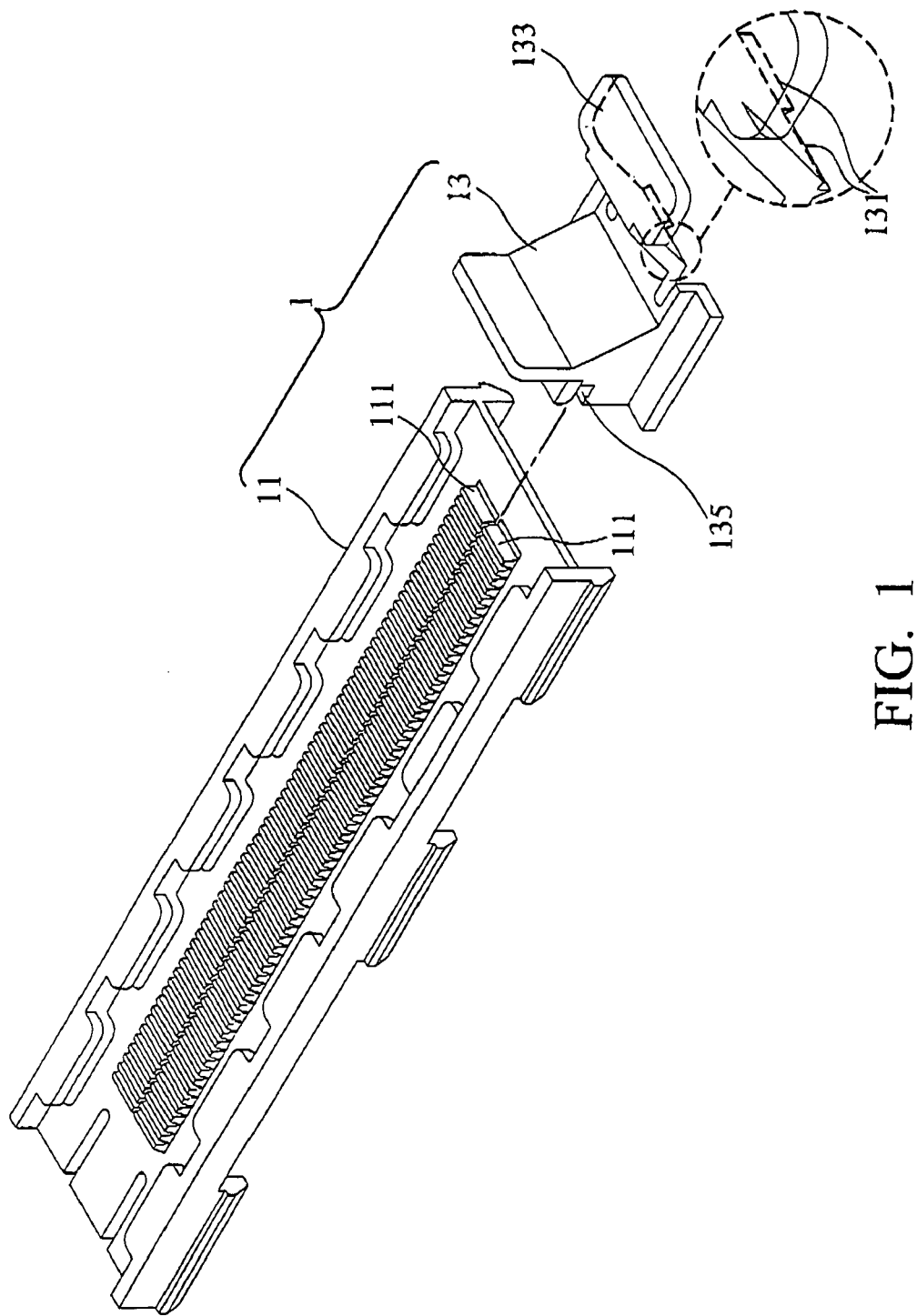
FIG. 1 is a schematic diagram of a mounting assembly of a first embodiment before assembly.
Figure 2:
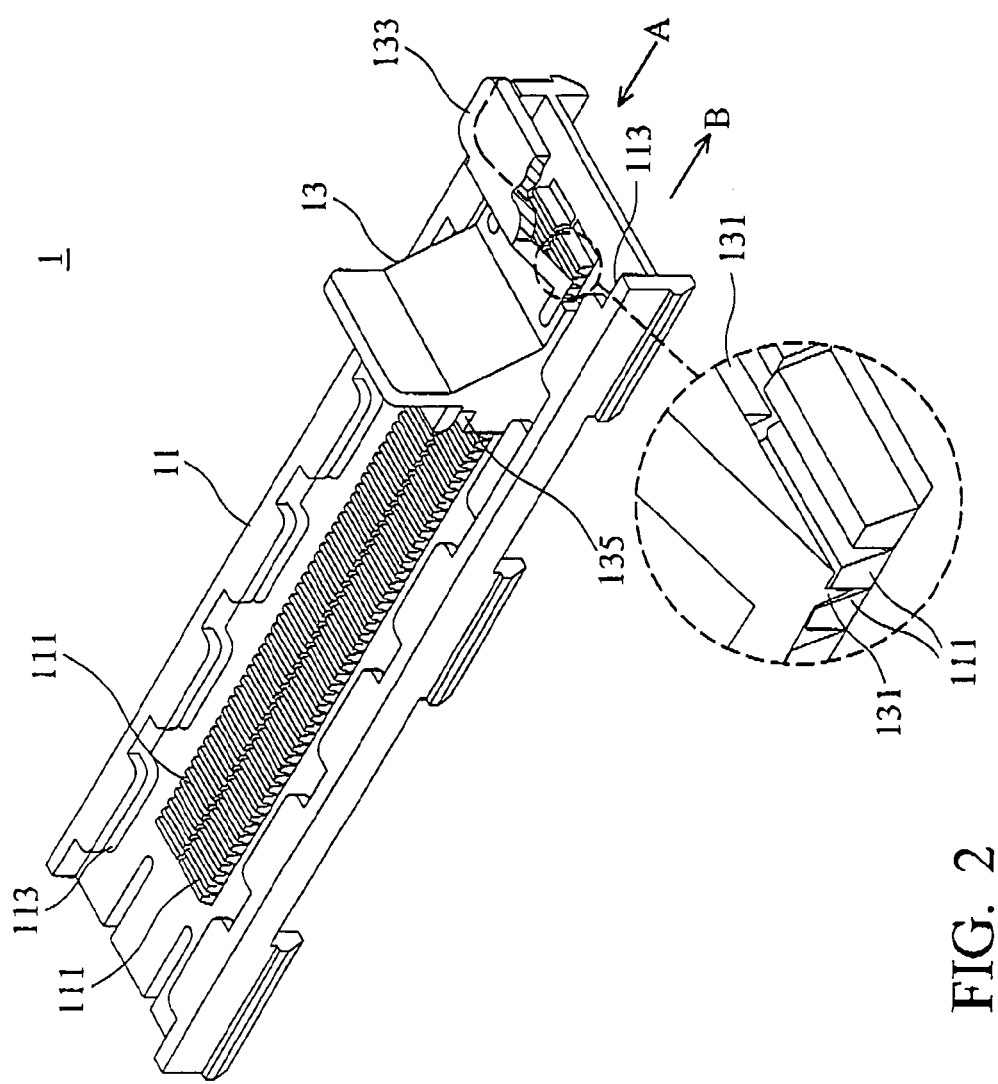
FIG. 2 is a schematic diagram of the mounting assembly of the first embodiment after assembly.

A mounting assembly of the present invention is shown in FIGS. 1 to 4. The mounting assembly comprises a base 11 and a clip 13 slidably disposed therein. The mounting assembly is for a main board in a housing of an electronic device, standard features of which are not described.

The base 11 has two first engaging potions 111, such as two adjacent racks, comprising a series of teeth formed as shown, staggered and not overlapping providing fine-tuning of the position of the clip 13. Two first engaging portions 111 are an example, not limited to the disclosed embodiments, and numbers thereof can vary with demand.

The base 11 has a locating member to secure the clip 13 therein. In the embodiment, the locating member comprises two tracks 113 formed at both sides of the base 11, but is not limited to this manner. The locating member can take any form allowing the clip 13 to slidably move on the base 11. Two tracks 113 can be set in other locations as long as the clip 13 is fixed on the base 11.

The clip 13 is slidably mounted in the base 11 in a first direction A and a second direction B opposite thereto. As shown in FIG. 1, the clip 13 is slidably disposed on the tracks 113 of the case 11.

The clip 13 has two second engaging portions 131 and an actuating portion 133 as shown in FIG. 1. The second engaging portions 131 have teeth which engage the first engaging portion 111 (racks). When the clip 13 moves in the first direction A, the first engaging portions 111 contact the second engaging portions 131, mounting the main board 3 on the housing.

In this embodiment, the form of the second engaging portion 131 is an example and is not intended limit to the disclosure. The second engaging portion numbers can vary with demand according to the number of first engaging portion. The second engaging portion also can be a hook or other equivalent member.

The actuating portion 133 releases the first and second engaging portions 111 and 131. When force is applied on the actuating portion 133, the second engaging portion 131 separates from the first engaging portion 111, enabling the clip 13 to move in either direction A or B, effecting release of the main board 3. In the embodiment, the actuating portion 133 is a handle. The second engaging portion 131 is raised with the actuating portion 133 to separate the first and second engaging portions 111 and 131.

Figure 3:
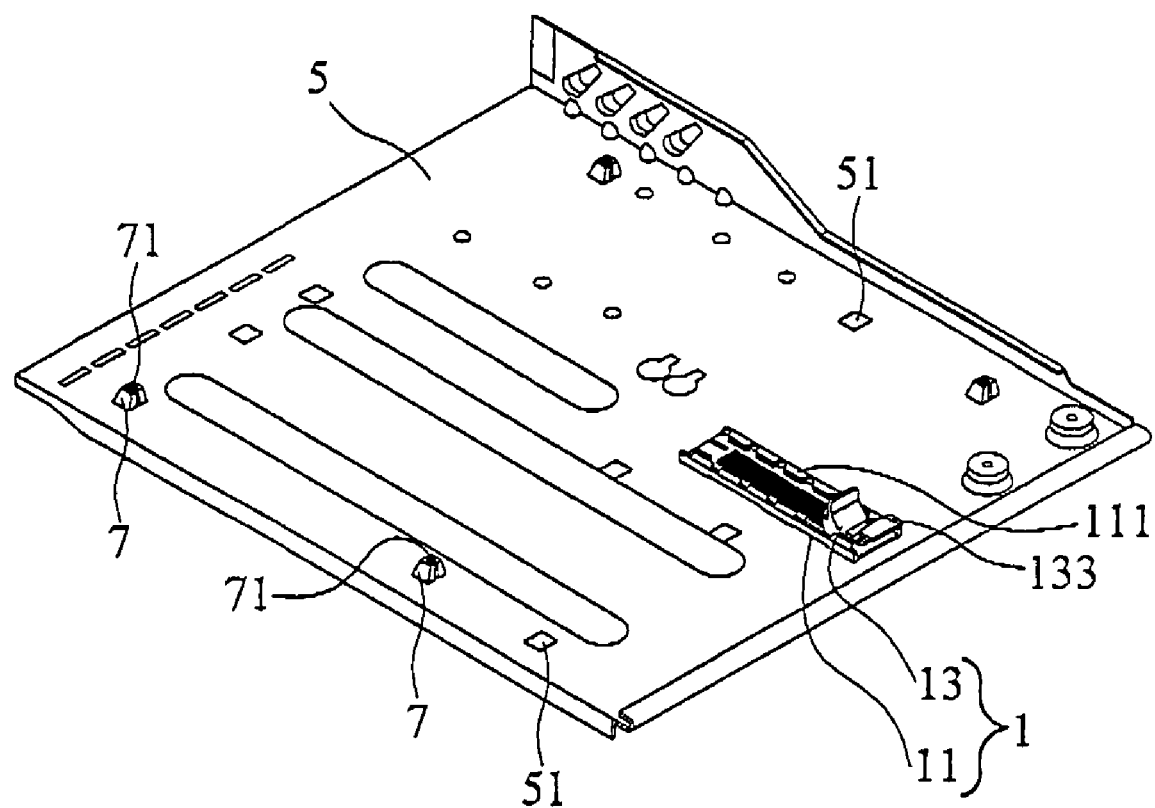
FIG. 3 is a schematic diagram of the mounting assembly mounted on a housing of an electronic device.

The clip 13 further has a holding portion 135 which supports the main board 3 by a predetermined distance from the electronic device 5. The holding portion 135 can be formed as a recess. When the clip 13 moves in the first direction A near the main board 3, the holding portion 135 (recess) holds the main board 3. The holding portion 135 holds the main board 3 at a predetermined height to maintain a distance between the main board 3 and the housing 5. Further, several supporters 7 are disposed on the housing 5 without screws, as shown in FIG. 3, to maintain the distance between the main board 3 and the housing 5. The supporter 7 is not limited to the disclosure and numbers can vary with demand.

When the first engaging portion 111 comprises two racks with a series of teeth, staggered and not overlapping, every step of the second engaging portion 131 is half that when the first engaging portion 111 comprises only a single rack. Further, when the first engaging portion 111 comprises three racks with a series of teeth, staggered and not overlapping, every step of the second engaging portion 131 is one third that when the first engaging portion 111 comprises only a single rack.

Namely, the number of racks can be increased to fine-tune positioning of the clip 13. The number of teeth can also be increased or decreased to provide accuracy.

Due to the first and second engaging portions 111 and 131 functioning in opposite directions, according to the mechanical inclined plane theorem, the clip 13 may move in the first direction A via the second engaging portion 131, but may not move in the second direction B, whereby the first and second engaging portions 111 and 131 obstruct each other, limiting the clip 13. Namely, when force is not applied on the actuating portion 133, the clip 13 is limited to be only the first direction A.

The mechanical inclined plane theorem is well known in the art. The theorem posits that when a body moves along a smooth ramp, a force which can push the body to the top of the tamp is shown as F=Wh/d, wherein F is the force parallel to the ramp applied on the body, W is the weight of the body, h is the height of the ramp, and d is the length of the ramp. The ramp may reduce the required force due to the mechanical profit (ratio of d/h). If the ramp is gradual, the mechanical profit is greater. Namely, when the ramp is longer or the height of the ramp is lower (the deflect angle is smaller), less force is required. For example, a zipper is an example of the mechanical inclined plane theorem. The inclined edge of the zipper enables a relatively small force to engage the zipper.

As mentioned, the mounting assembly of the present invention mounts a main board 3 to a housing 5 based on the mechanical inclined plane theorem. The first engaging portion ill of the base 11 firmly engages the second engaging portion 131 of the clip 13 to secure the main board 3 in the housing 5. The clip 13 is limited to hold the side of the main board 3 and cannot draw back (to second direction B) when no force is applied on the clip 13.

The first engaging portion ill is not limited to a rack or other equivalent member with ramp, nor the second engaging portion 131 is limited to a rack, a teeth, a hook or other equivalent member, as long as the clip 13 is limited to only the main board's fixing direction via the first and second engaging portions 111 and 131, and further producing positive engagement between main the board 3 and the housing 5. The first and second engaging portions 111 and 131 can be limiting members or other equivalent members.

Figure 4:
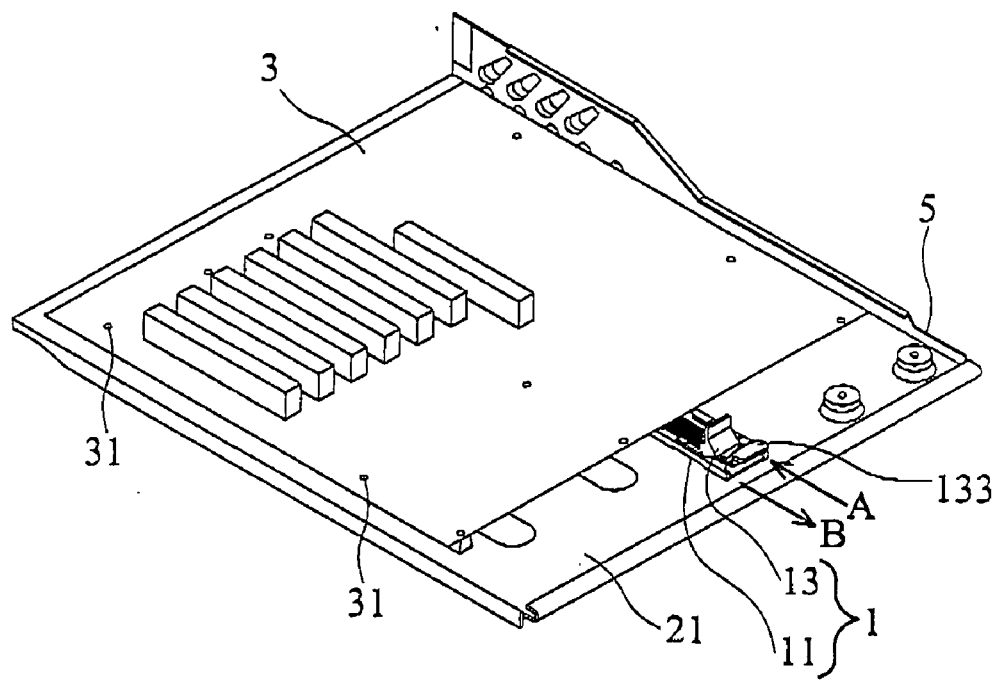
FIG. 4 is a schematic diagram of the mounting assembly secured the main board to the housing.
Figure 5:
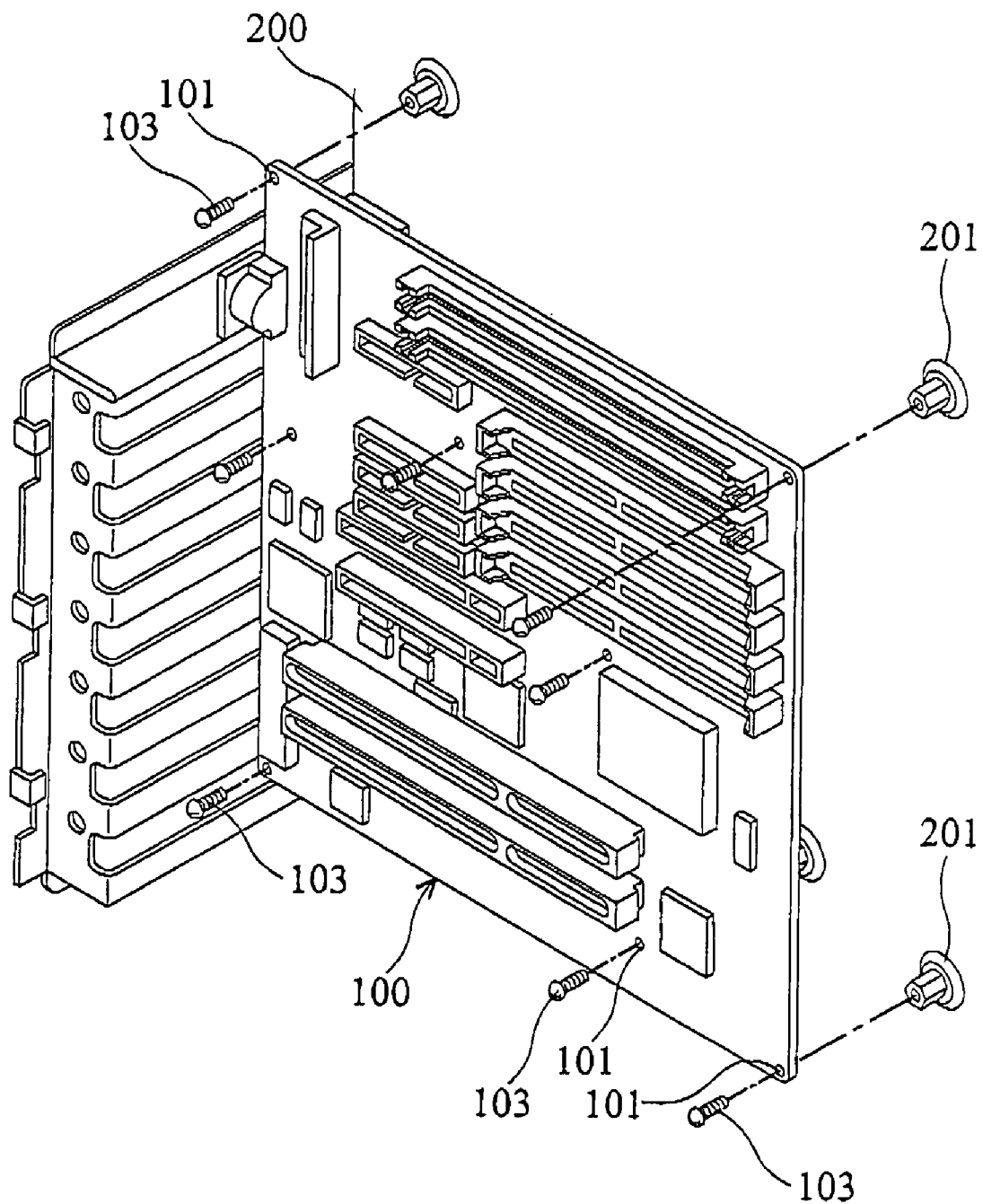
FIG. 5 is a schematic diagram of a conventional fastener engaged a main board to a housing.

Unlike conventional attachment engaging screws to spacers, the present invention only places a base l ion a housing S, moving the clip 13 along the base 11 until the main board 3 is supported by the holding portion 135 of the clip 13, and then the main board 3 is fixed in the appropriated location in the housing 5. In FIGS. 3 and 4, several supporters 7 without screws are placed on the housing 5, and several through holes 31 corresponding to supporters 7 are disposed on the main board 3. The tops 71 of the supporters 7 pass through the through holes 31 respectively, and the supporters 7 support the main board 3 in the housing 5.

The mounting assembly 1 of the present invention numbers varies with demand to secure the main board 3 mounted on the housing 5. The supporter 7 and the through hole 31 can enhance engagement but are not necessary. In the present invention, the base has a predetermined length, such that the clip 13 slidably mounts on the base in the first direction A (fixing direction) and the second direction B (separating direction). Thus, the mounting assembly of the present invention fixes different sizes of main boards 3.

To disengage the main board 3 from the housing 5, a force applied on the actuating portion 133 separates the second engaging portion 131 from the first engaging portion 111. Afterward, the clip 13 can slidably move in first direction A and second direction B, allowing the main board 3 to easily separate from the housing 5.

The mounting assembly 1 of the present invention fixes the main board 3 on the housing 5 without requiring holes disposed on the main board 3, improving on conventional art in which position and quantity of electronic elements are limited by the holes. To further enhance engagement, supporters 7 without screws are used.

The following describes a second embodiment, from which elements common to the first embodiment are omitted.

Figure 6A:
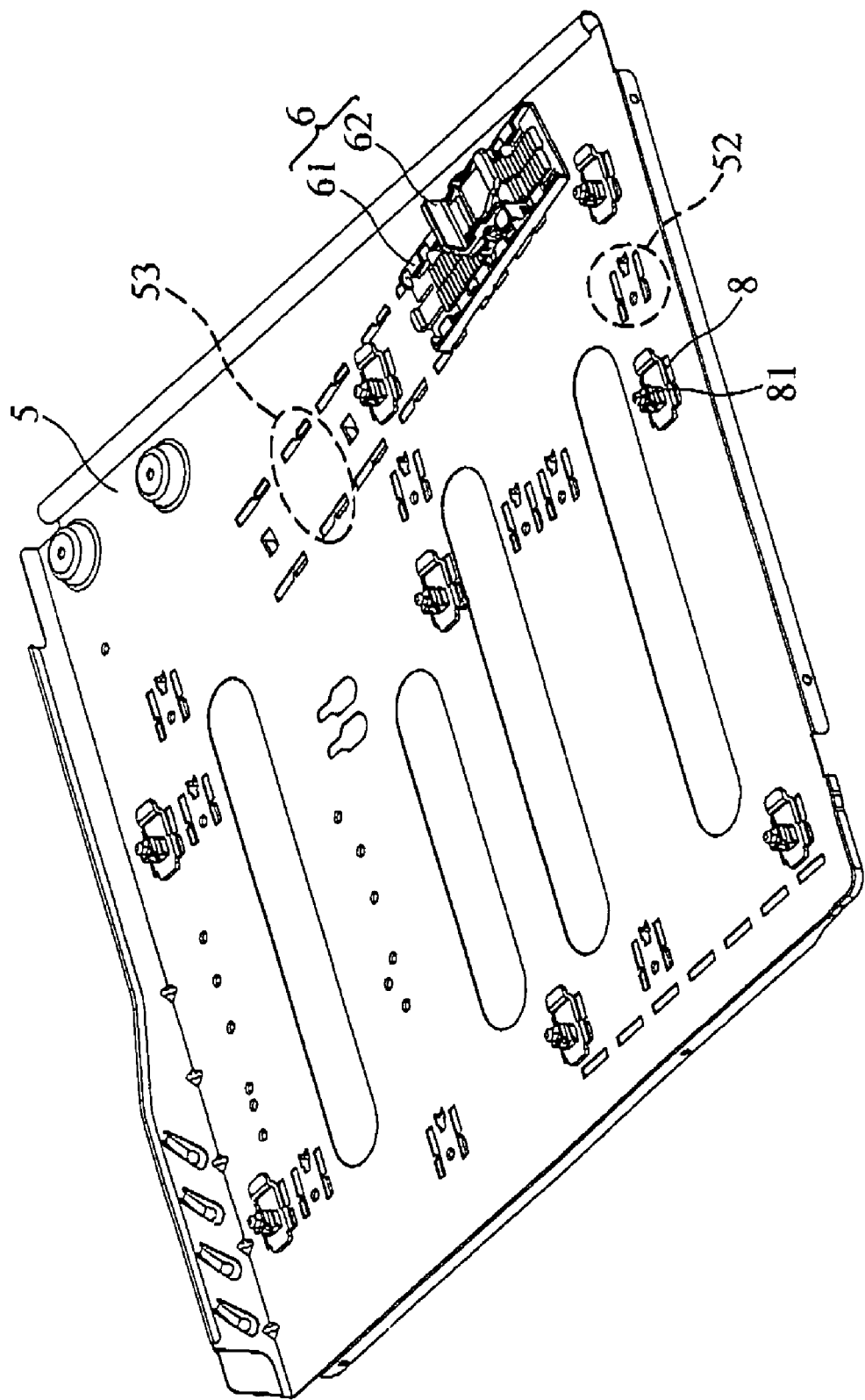
FIG. 6a is a schematic diagram of another mounting assembly of the present invention mounted on the housing.
Figure 6B:
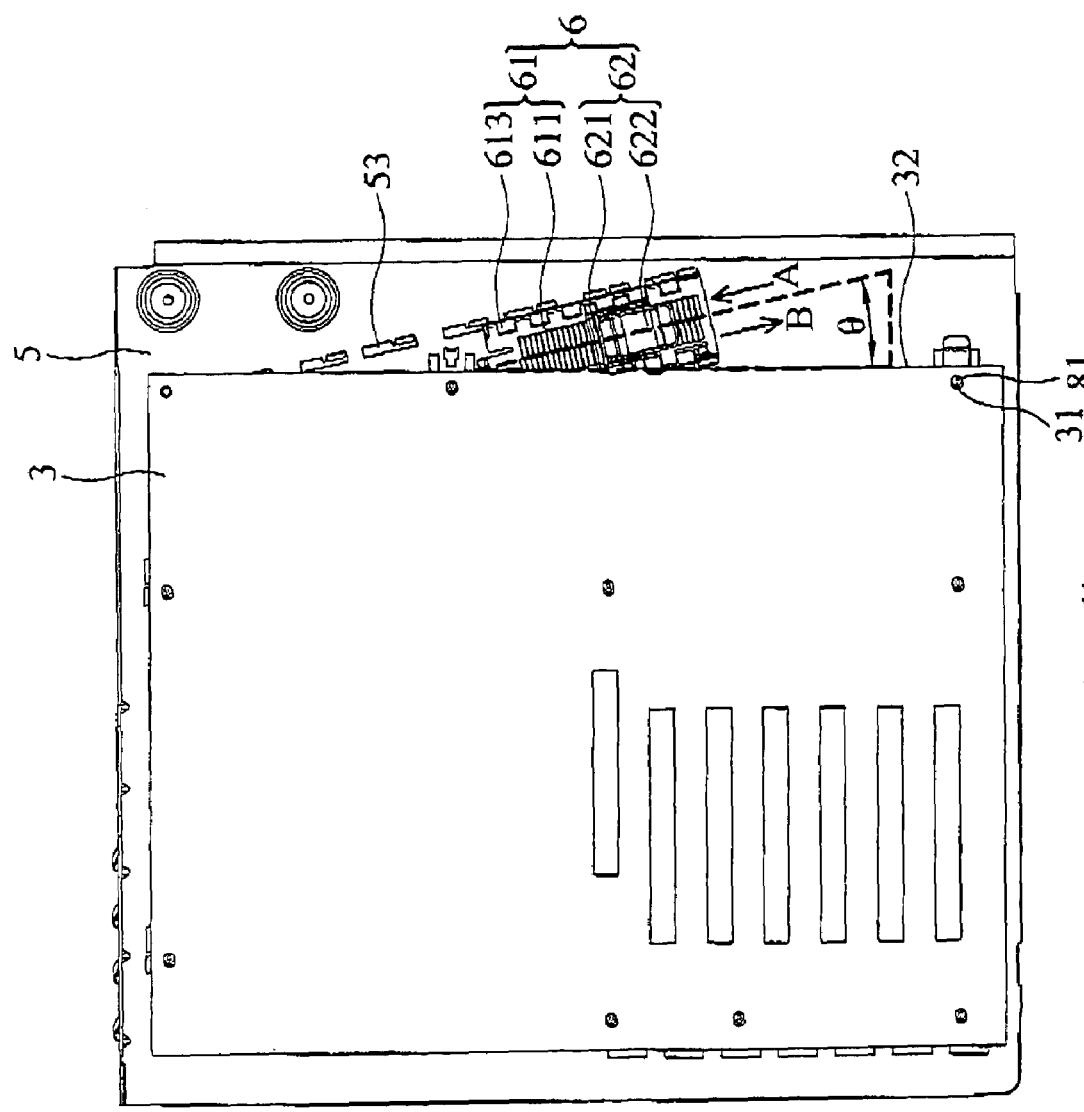
FIG. 6b is a schematic diagram of the mounting assembly secured the main board to the housing.

FIGS. 6a and 6b show a mounting assembly 6 mounted on the housing 5. The housing 5 has openings 53 appropriately located to engage with the mounting assembly 6, fixing the main board 3 on the housing 5 via the mounting assembly 6. A distance is formed between the main board 3 and the housing 5 by supporters 8. Several openings 52 are disposed on the housing 5 in appropriate locations in which the supporters 8 respectively engage. As shown in FIG. 6b, the main board 3 has through holes 31 corresponding to the supporters 8. The engaging portion 81 of each supporter 8 passes through the through hole 31 and supports the main board 3 on the housing 5, and then the mounting assembly 6 is used to fix the main board 3.

The mounting assembly 6 comprises a base 61 and a clip 62. When the mounting assembly 6 is disposed on the housing 5, an acute angle is formed between the sliding direction of the clip 62 and the edge 32 of the main board 3, allowing the clip 62 to fine-tune the position. The edge 32 mentioned is the side at which the main board 3 contacts the mounting assembly 6 when the main board 3 is fixed by the mounting assembly 6.

The present invention utilizes sine theorem of trigonometric function. As shown in FIG. 6b, the base 61 lies along the hypotenuse, the edge 32 on the adjacent edge and an acute angle θ is formed therebetween, for example 30°. When clip 62 moves along the hypotenuse distance L, the diagonal side moves LSinθ distance, such that the clip 62 can fine-tune the position of the main board 3.

FIGS. 7a to 7f show schematic diagrams of the mounting assembly 6. The mounting assembly 6 includes a base 61 and a clip 62 disposed thereon slidably in a first direction A and a second direction B. The first and second directions are opposite. In the embodiment, the base 61 is rectangular and a first engaging portion 611 is disposed on one face of the base 61. The first engaging portion 61 may be two racks with a series of staggered teeth not overlapping, to provide the clip 61 with fine-tuning.

The moving distance of the clip 62 corresponds to the size and gap of the teeth. With larger teeth, efficiency of fine-tune is decreased. With smaller teeth, efficiency of fine-tune is enhanced but the production is difficulty and the strength is reduced. Therefore, the clip 62 has two racks with a series of teeth, staggered and not overlapping, to solve the problem mentioned, utilizing sine theorem to secure the clip 62 with precise fine-tuning capabilities.

Meanwhile, two locating members 613, such as two tracks, are mounted on both sides of the base 61 to secure the clip 62 in the base 61. A stem 615 is disposed on one end of the base 61 to separate the base 61 from the housing 5 when force is applied thereon.

Figure 7A:
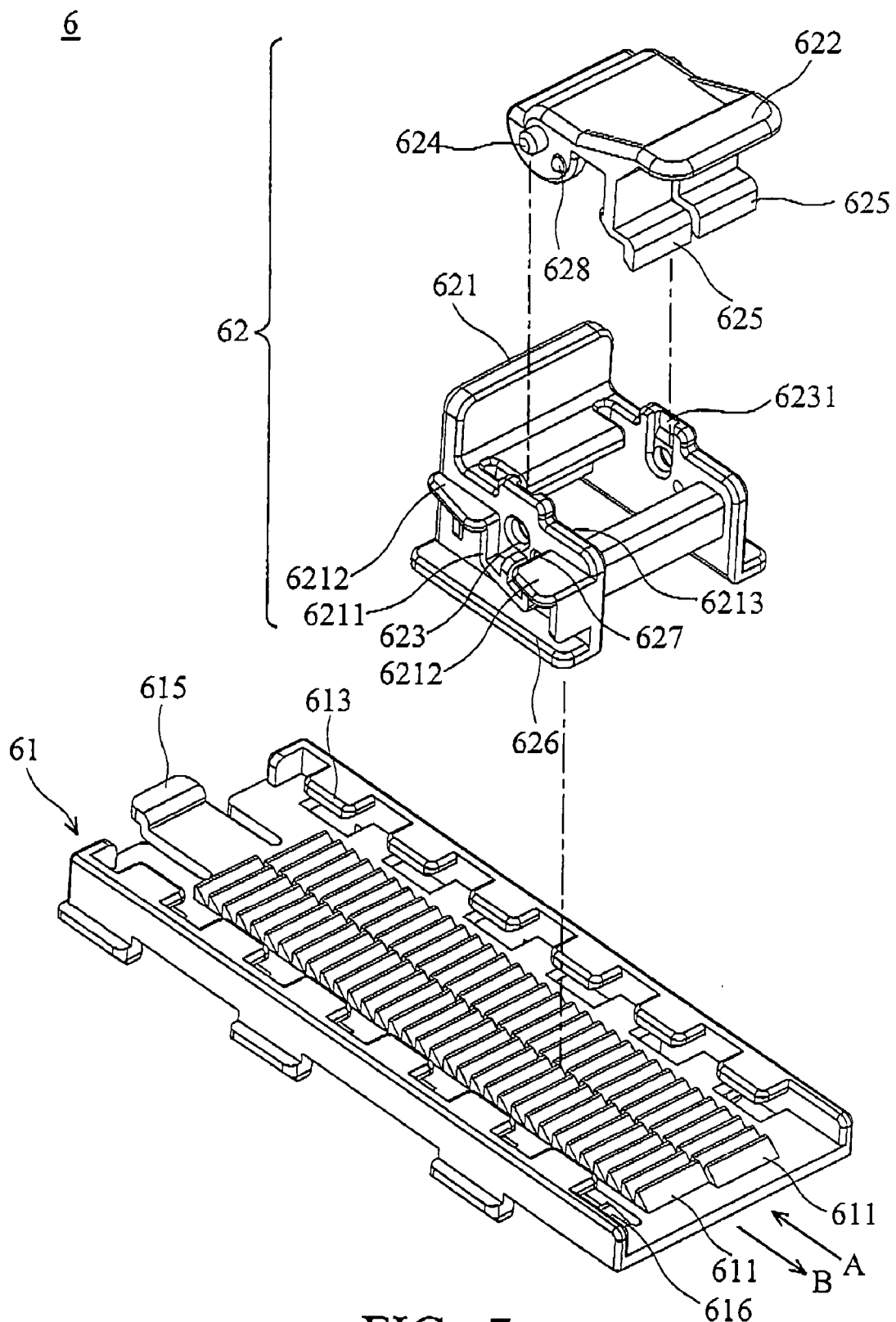
FIG. 7a is a schematic diagram of a mounting assembly of a second embodiment before assembly.
Figure 7B:
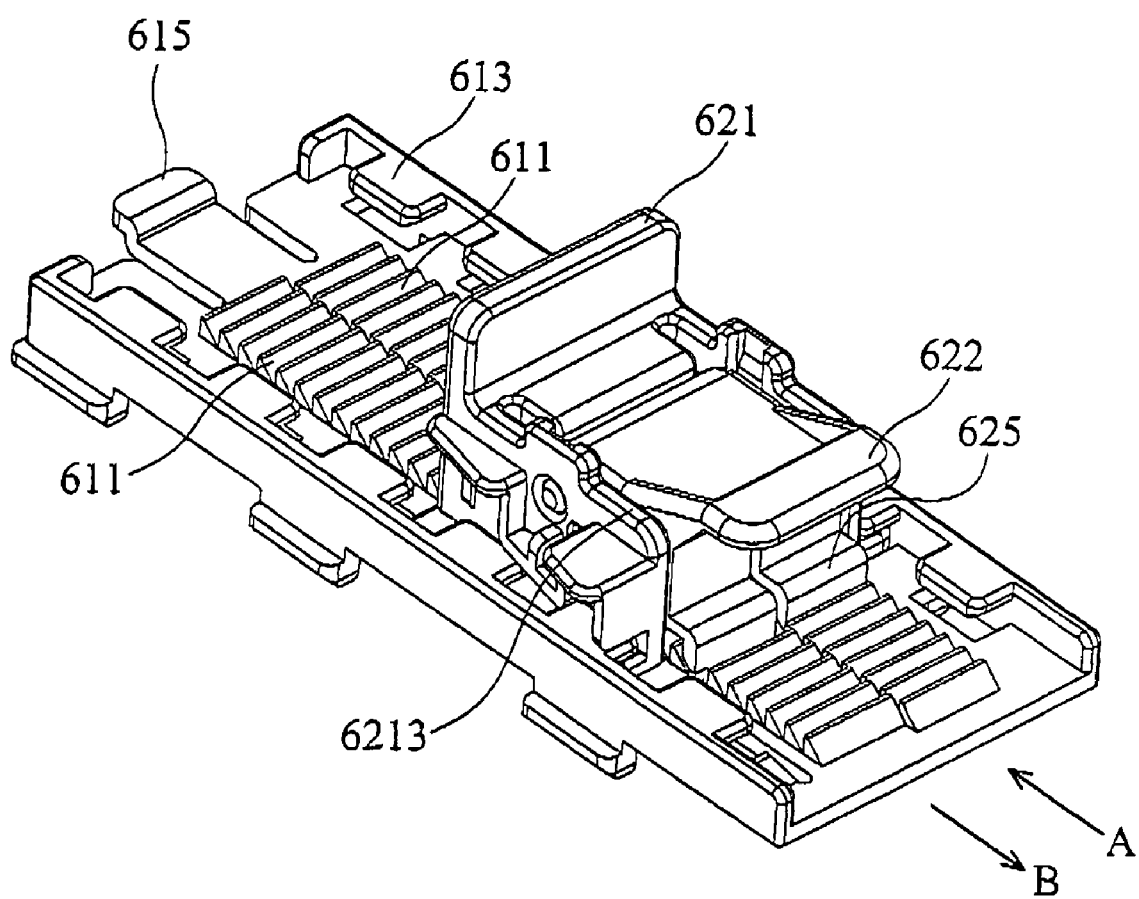
FIG. 7b is a schematic diagram of the mounting assembly of the second embodiment before assembly.
Figure 7C:
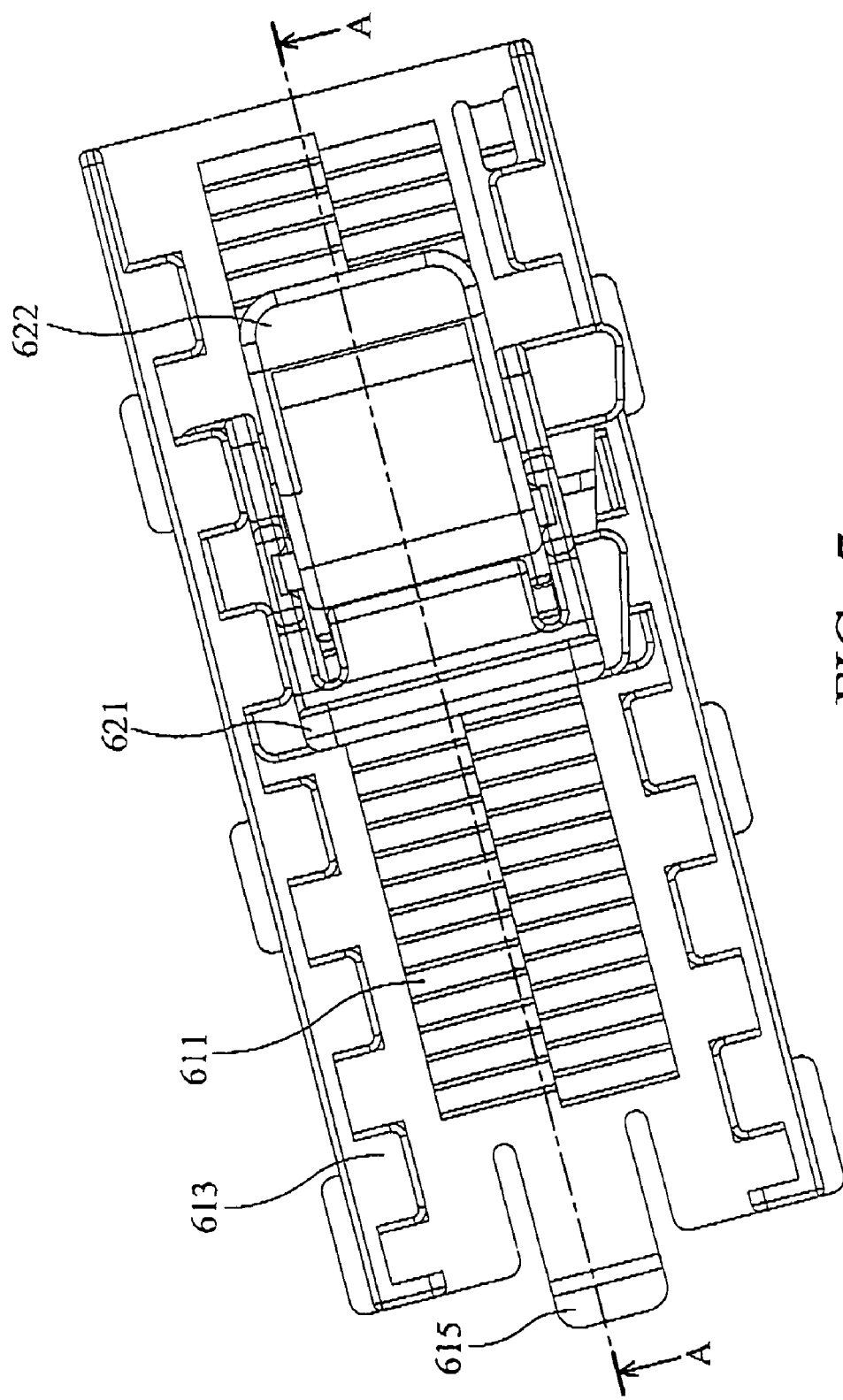
FIG. 7c is a top view of the mounting assembly of the present invention.
Figure 7D:
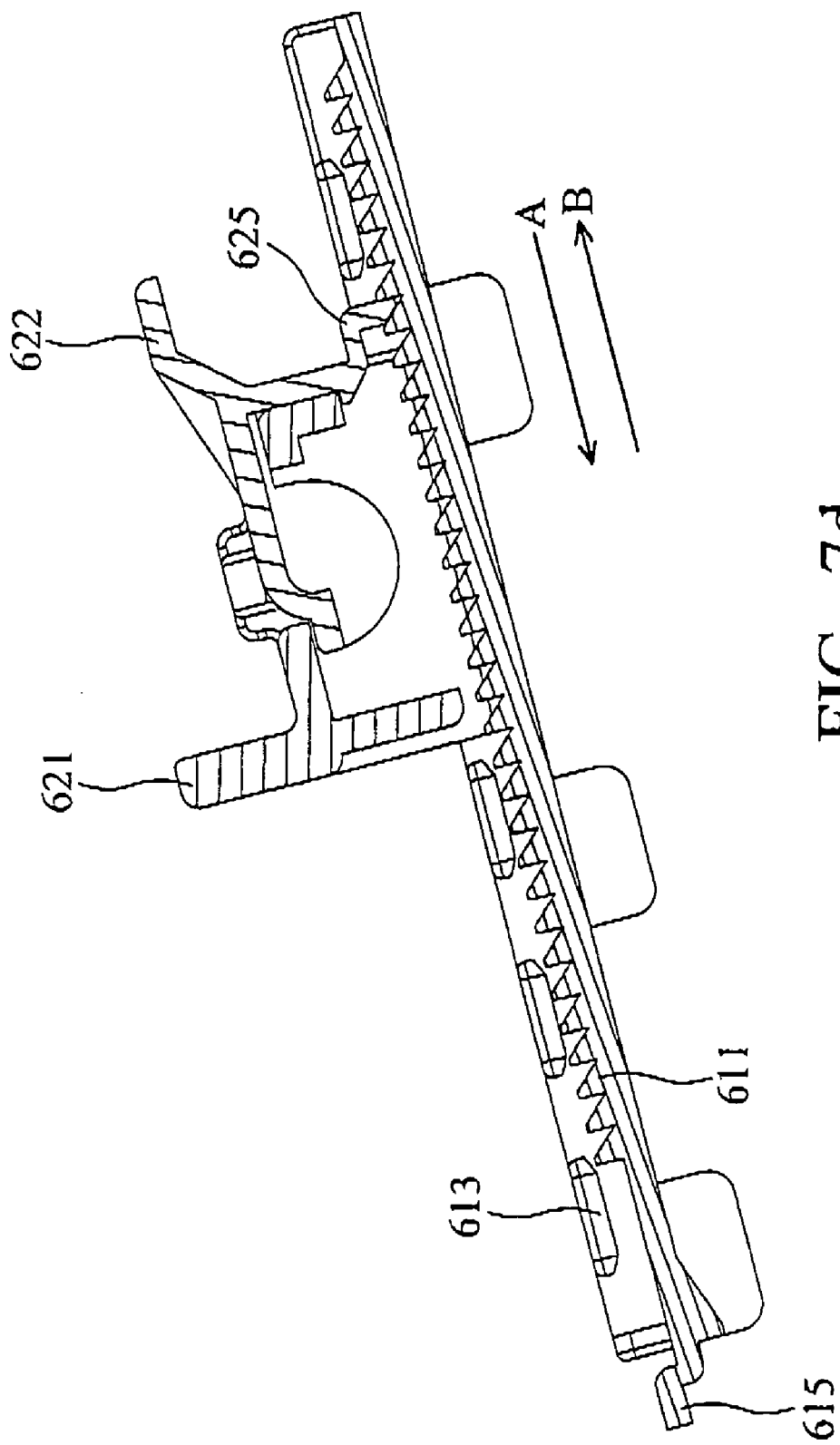
FIG. 7d is a cross-section along line A—A of FIG. 7c.

The clip 62 comprises a body 621, an actuating portion 622 and a second engaging portion 625. For example, the second engaging portion 625 can be a hook disposed under the actuating portion 622. In FIG. 7d, when the first engaging portion 611 engages the second engaging portion 625, the clip 62 is limited to the first direction A only. The actuating portion 622 separates the second engaging portion 625 from the first engaging portion 611 so that the clip 62 moves slidably in the first direction A and the second direction B. Additionally, the clip 62 comprises two flanges 626 protruding from both sides of the body 621. The clip 62 slidably moves along the base 61 via the flanges 626.

The body 621 has an opening 623, the actuating portion 622 has a shaft 624, and the shaft 624 passes through a groove 6231 and engages to the opening 623 so that the actuating portion 622 rotatably connects to the body 621. The body 621 has a hole 627, the actuating portion 622 has a tab 628 engaging the hole 627 to prevent the second engaging portion 625 separating from the first engaging portion 611. At this point, the clip is limited to the first direction A only. Upon disengagement, a force applied on the actuating portion 622 raises it so that the tab 628 separates from the hole 627, and then the second engaging portion 625 separates from the first engaging portion 611. Finally, the clip 62 is moveable in both first direction A and the second direction B. At the same time, the tab 628 contacts the upper edge of the side wall 6213 of the body 621, enhancing stability of the actuating portion 622, preventing vibration with movement of the clip 62.

Figure 7E:
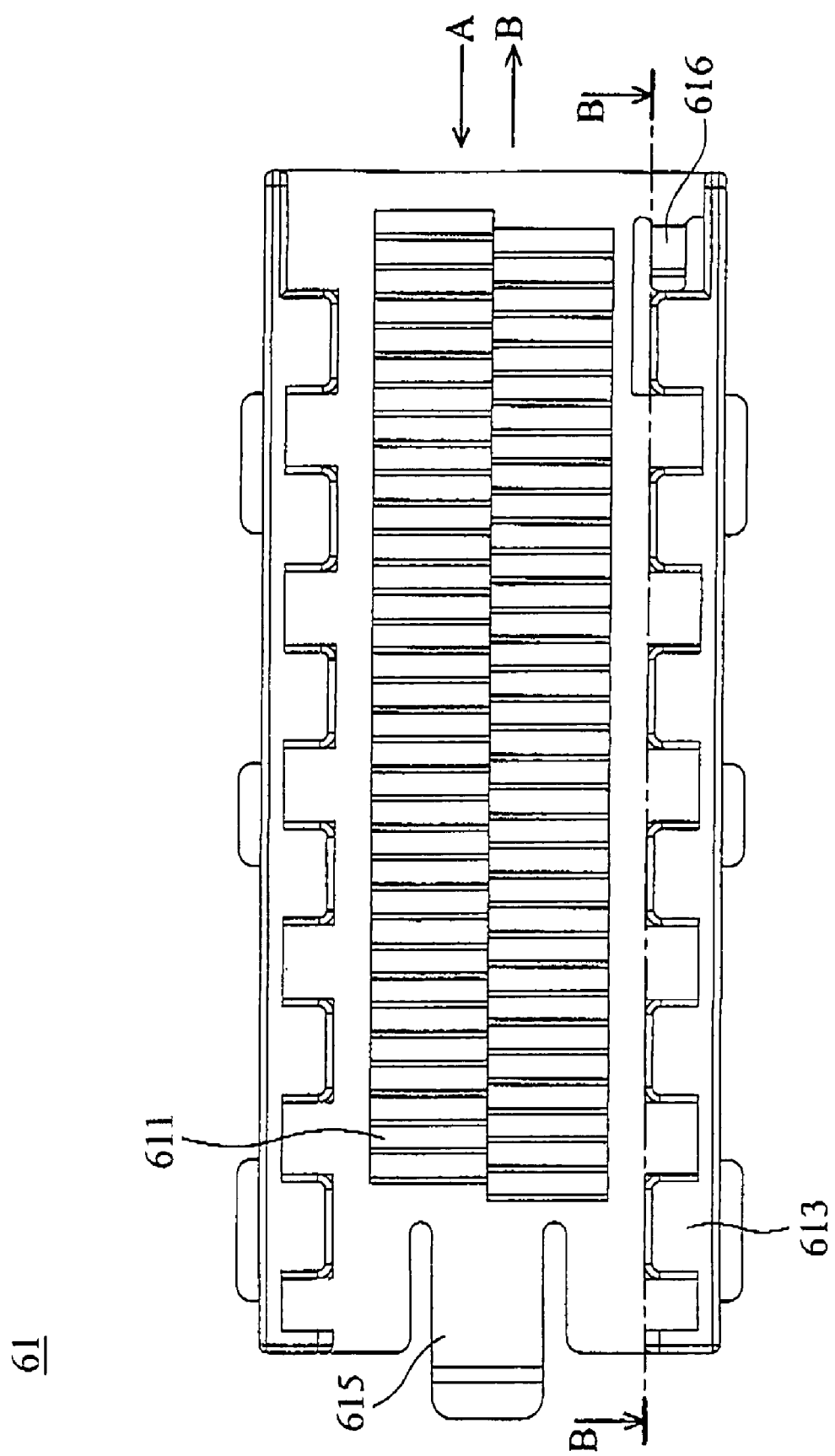
FIG. 7e is a schematic diagram of a base of the present invention.
Figure 7F:
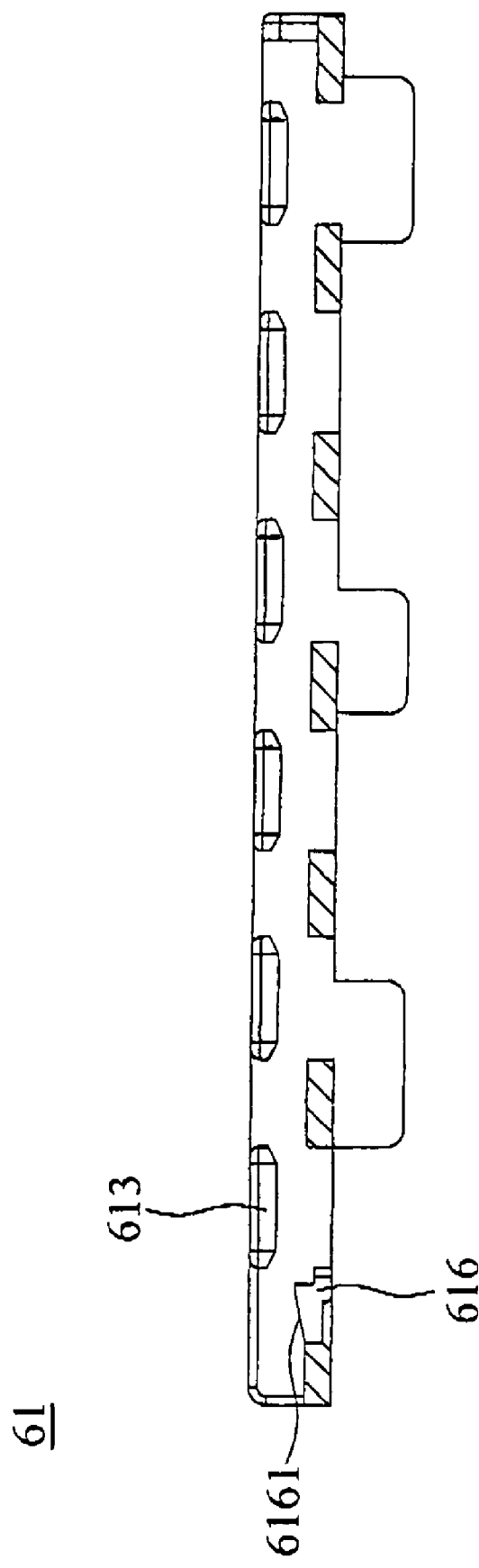
FIG. 7f is a cross-section along line B—B of FIG. 7e.

In FIGS. 7e and 7f, an obstacle 616 is disposed at an end of the base 61. The obstacle 616 may be formed as a wedge-shaped block, angled surface 6161 in the same direction as the teeth of the first engaging portion 611. When assembles the clip 62 to the base 61, the clip 62 passes the angled surface 6161 along the first direction A and into the base 61. The clip 62 slidably moves in the first direction A and the second direction B, and the obstacle 616 prevents the clip 62 from separation from the base 61.

Furthermore, a first supporting portion 6211 and a second supporting portion 6212 abutting and fixing the main board 3 are disposed on the side wall 6213 of the body 621 of the clip 62. The first supporting portion 6211 has a ramp formed by a plurality of ribs, the surfaces of which constitute the ramp. Otherwise, the first supporting portion 6211 faces the locating member 613. When the clip 62 fixes the main board 3, the first supporting portion 6211 contacts the edge 32 of the main board 3, and the second supporting portion 6212 fixes the main board 3 at the same time.

As mentioned, the present invention, by way of mechanical inclined plane theorem, firmly fixes the main board to the housing, without screws or tools, improving on shortcomings of the conventional mounting assembly.

In the mounting assembly of the present invention, the clip is slidably disposed on a base which has a predetermined length along the fixing direction or the release direction. The length can vary with the size of the main board. Thus, the mounting assembly fixes different sizes of main boards.

The mounting assembly of the present invention mounts a main board to a housing without engaging screws to spacers respectively as conventional attachment. Screws require less help the assembling procedure to save times, improving on conventional art in which position and quantity of electronic elements are limited by the holes on the main board.

The present invention improves the effects of the conventional mounting assembly, The present invention can assemble or separate different sizes of main boards to a housing without tools, thereby simplifying the process of assembling or separating.

Finally, while the invention has been described by way of example and in terms of the preferred embodiments, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A mounting assembly for fixing a main board on a housing of an electronic device, comprising:
    a base having a first engaging portion; and
    a clip disposed in the base slidably in a first direction and a second opposite direction, wherein when moving in the first direction, the clip fixes the main board, and in the second direction, releases the main board; the clip comprising:
    a second engaging portion engaging the first engaging portion to limit the clip to only the first direction; and
    an single actuating portion releasing the first and second engaging portions, when receiving a force, enabling the clip to be moved in either the first direction or the second direction;
    wherein a locating member is provided on the base to slidably dispose the clip on the base.

2. The mounting assembly as claimed in claim 1, wherein the first engaging portion comprises at least one rack with a series of teeth.

3. The mounting assembly as claimed in claim 2, wherein the number of racks of the first engaging portion is increased or decreased to enable fine-tuning of the position of the clip.

4. The mounting assembly as claimed in claim 2, wherein the number of teeth of the rack is increased or decreased to enable fine-tuning of the position of the clip.

5. The mounting assembly as claimed in claim 1, wherein the first engaging portion comprises two adjacent racks with a series of teeth, staggered and not overlapping, to provide fine-tuning of the position of the clip.

6. The mounting assembly as claimed in claim 5, wherein the number of racks of the first engaging portion is increased or decreased to enable fine-tuning of the position of the clip.

7. The mounting assembly as claimed in claim 5, wherein the number of teeth of the rack is increased or decreased to enable fine-tuning the position of the clip.

8. The mounting assembly as claimed in claim 1, wherein the clip comprises a holding portion to hold the main board.

9. The mounting assembly as claimed in claim 8, wherein the holding portion comprises a recess to receive the main board.

10. The mounting assembly as claimed in claim 8, wherein the holding portion holds the main board at a predetermined height to maintain a distance between the main board and the housing of the electronic device.

11. The mounting assembly as claimed in claim 1, wherein the first direction is a direction in which the clip fixes the main board.

12. The mounting assembly as claimed in claim 1, wherein the second engaging portion comprises a plurality of hooks.

13. The mounting assembly as claimed in claim 1, wherein the second engaging portion comprises a plurality of teeth.

14. The mounting assembly as claimed in claim 1, wherein the first and second engaging portions are deflected in opposite directions.

15. The mounting assembly as claimed in claim 1, wherein the actuating portion releases the first and second engaging portions by raising the second engaging portion, enabling the clip to be moved in either the first direction or the second direction.

16. The mounting assembly as claimed in claim 1, wherein the second direction allows separation the main board and the electronic device.

* * * * *